United States Patent
Günthner et al.

(10) Patent No.: US 9,862,596 B2
(45) Date of Patent: Jan. 9, 2018

(54) COMPONENT HAVING A SUBSTRATE WITH CAVITIES WITH MICROMECHANICAL STRUCTURES LOCATED THEREIN

(71) Applicant: Continental Teves AG & Co. OHG, Frankfurt (DE)

(72) Inventors: Stefan Günthner, Frankfurt (DE); Bernhard Schmid, Friedberg (DE)

(73) Assignee: CONTINENTAL TEVES AG & CO. OHG, Frankfurt (DE)

( * ) Notice: Subject to any disclaimer, the term of this patent is extended or adjusted under 35 U.S.C. 154(b) by 397 days.

(21) Appl. No.: 14/355,464

(22) PCT Filed: Nov. 2, 2012

(86) PCT No.: PCT/EP2012/071721
§ 371 (c)(1),
(2) Date: Apr. 30, 2014

(87) PCT Pub. No.: WO2013/064632
PCT Pub. Date: May 10, 2013

(65) Prior Publication Data
US 2014/0306300 A1 Oct. 16, 2014

(30) Foreign Application Priority Data
Nov. 3, 2011 (DE) .......................... 10 2011 085 723

(51) Int. Cl.
*B81C 1/00* (2006.01)
*G01P 15/08* (2006.01)

(52) U.S. Cl.
CPC ...... *B81C 1/00293* (2013.01); *B81C 1/00357* (2013.01); *G01P 15/0802* (2013.01);
(Continued)

(58) Field of Classification Search
CPC .............. B81C 1/00293; B81C 1/0357; B81B 2201/0235; B81B 2201/0264
See application file for complete search history.

(56) References Cited

U.S. PATENT DOCUMENTS

| | | | |
|---|---|---|---|
| 2002/0051258 A1 | 5/2002 | Tamura | |
| 2008/0136000 A1* | 6/2008 | Fischer | ................ B81B 7/0041 257/682 |
| 2010/0028618 A1 | 2/2010 | Gonska et al. | |

FOREIGN PATENT DOCUMENTS

| | | |
|---|---|---|
| DE | 10 2004 027 501 A1 | 12/2005 |
| DE | 10 2008 040 970 A1 | 2/2010 |

(Continued)

OTHER PUBLICATIONS

L. Wang, X. Feng: Microfluidic Network for Research and Application in Fige Sciences: Process in Chemistry: vol. 17, No. 3: May 31, 2015.

(Continued)

*Primary Examiner* — Marcos D Pizarro
(74) *Attorney, Agent, or Firm* — Brinks Gilson & Lione

(57) ABSTRACT

A micromechanical component formed from, a substrate (100) having a first cavity (112) and a second cavity (113), a first micromechanical structure (117) arranged in the first cavity (112), and a second micromechanical structure (118) arranged in the second cavity (113). The first cavity (112) and the second cavities having respective first and second gas pressures having different values. The first gas pressure is provided by a closed configuration of the first cavity (112) and a first channel (115) opens into the second cavity (113), and the second gas pressure is adjustable via the first channel (115).

12 Claims, 12 Drawing Sheets

(52) U.S. Cl.
CPC ................ *B81B 2201/0235* (2013.01); *B81B 2201/0264* (2013.01)

(56) References Cited

FOREIGN PATENT DOCUMENTS

DE  10 2009 000 048 A1  7/2010
EP  1 167 979 A2  1/2002

OTHER PUBLICATIONS

PCT International Search Report—dated Feb. 25, 2013.
German Examination Report—dated Mar. 6, 2011.

\* cited by examiner

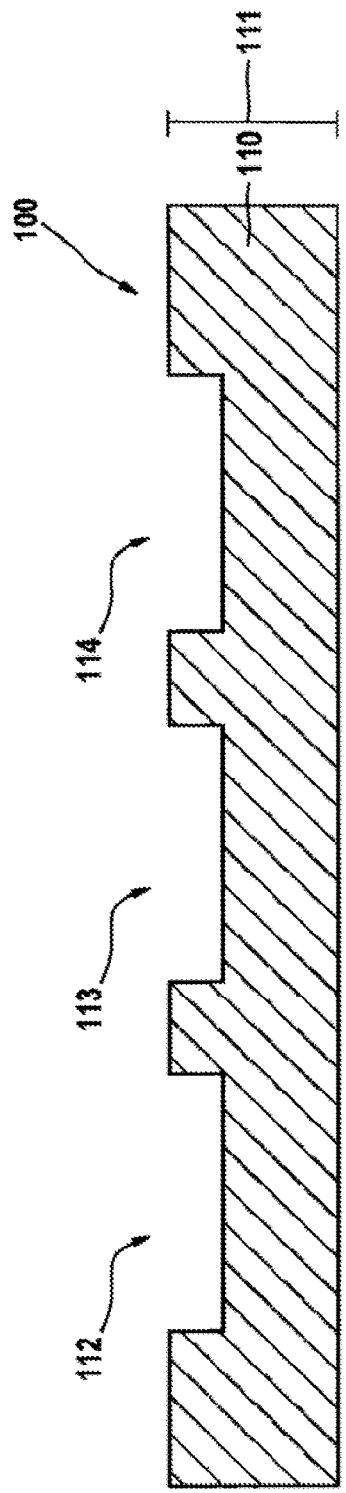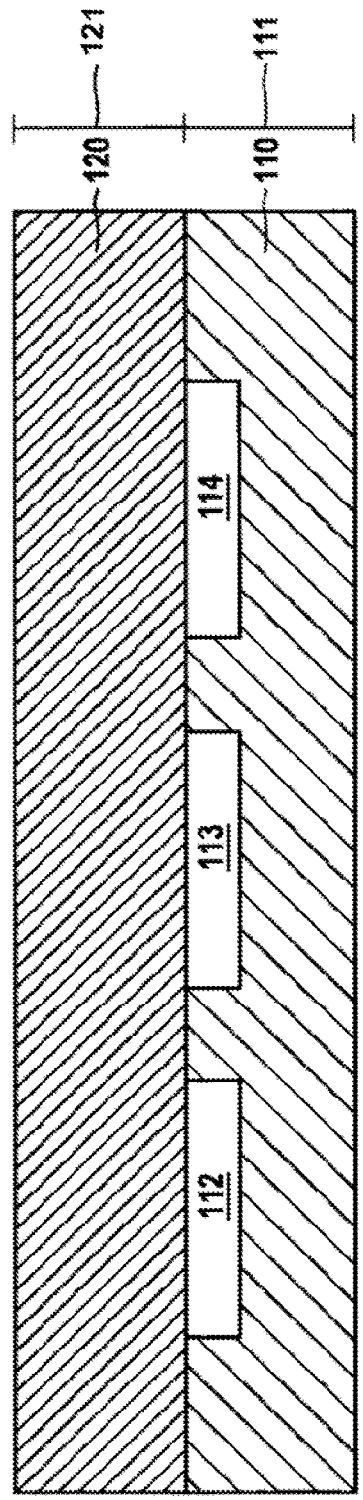

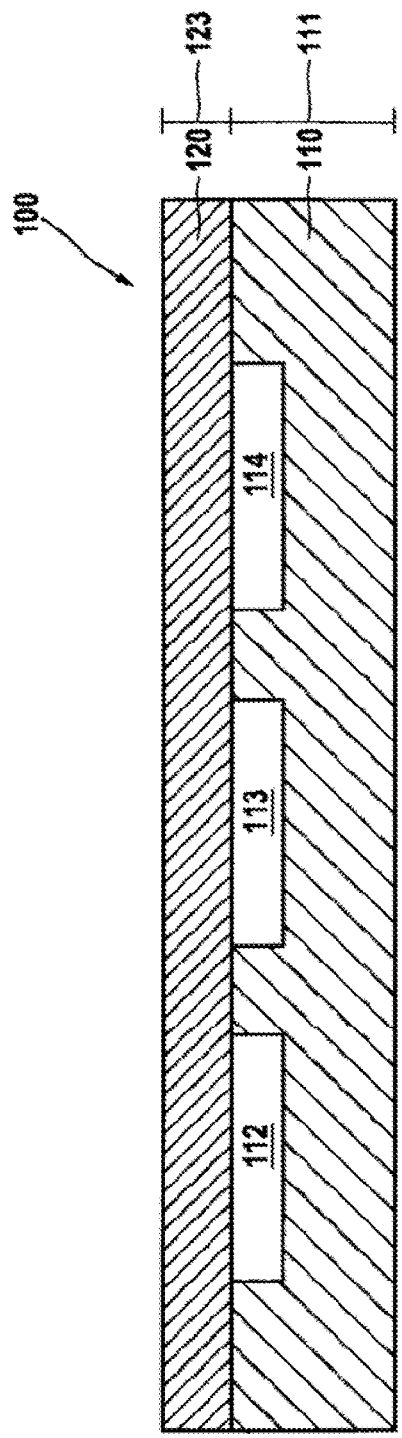
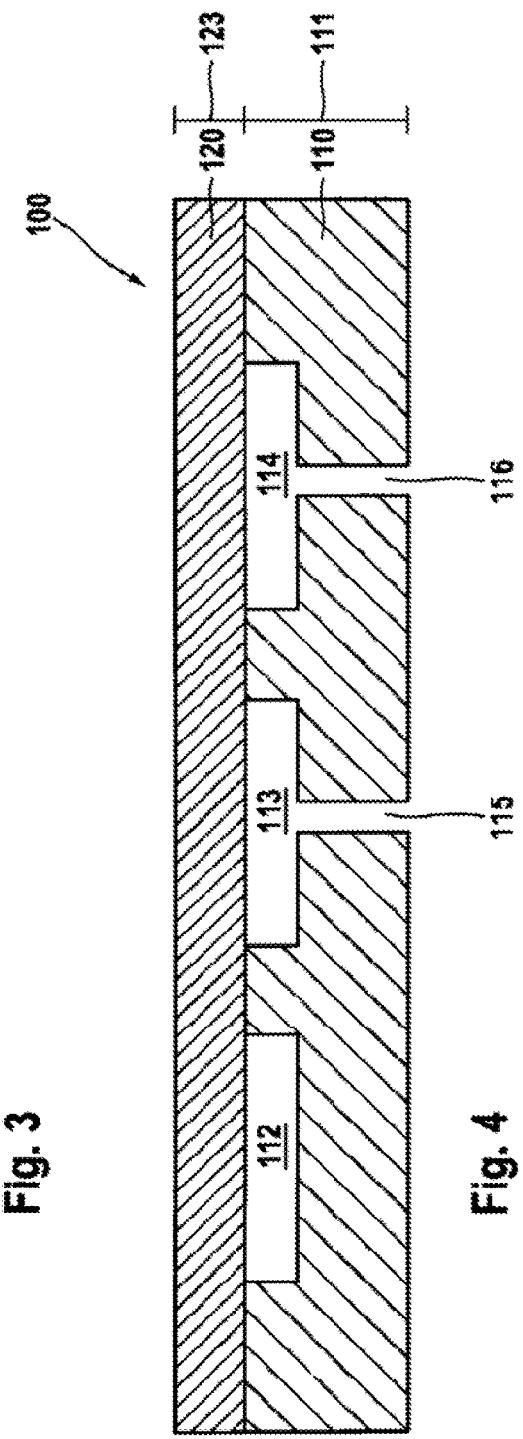
Fig. 3
Fig. 4

COMPONENT HAVING A SUBSTRATE WITH CAVITIES WITH MICROMECHANICAL STRUCTURES LOCATED THEREIN

CROSS REFERENCE TO RELATED APPLICATIONS

This application claims priority to German Patent Application No. 10 2011 085 723.0, filed on Nov. 3, 2011 and PCT/EP2012/071721, filed Nov. 2, 2012.

FIELD OF THE INVENTION

The present invention relates to a component and more specifically to a micromechanical sensor and a method for producing the micromechanical sensor.

BACKGROUND

A component is understood to mean a unit which provides a specific function. In this case, diodes, transistors, sensors can form a unit in order to provide mechanical and also electrical measurement objectives. Components can be provided in the form of electrodes in order to be able to be operated in a larger unit, such as an electrical circuit. A component can also be provided in the form of an integrated circuit on a chip. In this case, micromechanical structures can be formed, for example on a substrate which is defined with the aid of etching methods.

Nowadays, different types of micromechanical sensors, in particular inertial sensors, such as rate-of-rotation and acceleration sensors, are predominantly produced on different substrates. Consequently, different components are provided in order to achieve different measurement objectives.

In order to produce such electrical, mechanical or electromechanical components, use is made of methods and technologies which can typically be found in the semiconductor industry. One reason for separately producing the different sensors resides in the different physical requirements made of such sensors.

Consequently, different types of sensor are produced in different ways.

One type of sensor is a rate-of-rotation sensor, for example. Rate-of-rotation sensors are often encapsulated hermetically under a vacuum in order that they achieve high oscillation amplitudes as a result of subcritically damped resonant excitation, for example with a quality factor Q>0.5. However, a low electrical drive power is simultaneously provided in this case.

A further example of a type of sensor is an acceleration sensor. Acceleration sensors in comparison with rate-of-rotation sensors, by contrast, usually constitute a supercritically damped structure, for example with a quality factor Q<0.5. Acceleration sensors are typically constructed from mass oscillators, wherein the mass oscillators react to low-frequency accelerations. In this case, the relation between acceleration and mass deflection of an acceleration sensor should be linear to the greatest possible extent and have no resonant magnifications. In this case, a subcritical damping can also lead to incorrect measurements. This is the case if relatively high-frequency disturbances in the vicinity of the natural resonances of the acceleration pick-up act on the sensor, such that seismic masses of the acceleration sensor are excited in their resonant frequencies to carry out oscillations having large amplitudes. This can lead to high output signals which can no longer be adequately damped by output filters connected downstream.

Rate-of-rotation sensors and acceleration sensors are often required simultaneously for one measurement objective, for example in electronic stability control (ESP) or in roll-over protection systems in motor vehicles.

Various methods for providing these two types of sensor have been proposed heretofore.

One possibility is to provide an encapsulation of both structures of the rate-of-rotation sensor and of the acceleration sensor on a chip in a common cavity under a vacuum, wherein the acceleration sensor is subjected to greater damping artificially by electrical or signal processing methods.

This procedure has the disadvantages that structures in addition to the actual measurement transducer structures have to be integrated into the acceleration sensor, which increase the size of the sensor. Likewise, additional electronic circuit blocks have to be integrated into the signal processing (for example an application specific integrated circuit (ASIC)), which likewise increases the chip size of an integrated circuit (IC). In both cases, the production costs per chip are increased by the increased chip sizes. Consequently, the cost advantages of integration of both types of sensor on a chip are cancelled out or even turned negative.

A further possibility for providing different types of sensor is to provide an encapsulation of both sensor structures on a chip in a common cavity under defined pressure, wherein the acceleration sensor is supercritically damped. In this case, the required oscillation amplitude can be set by increased drive power and added drive structures within the rate-of-rotation sensor structure.

In the case of this procedure, as a result of the increased number of drive structures, the chip area of the rate-of-rotation sensor and the chip area of the ASIC are enlarged as a result of the provision of the higher drive power.

In order to provide a combination of two sensors, a further possibility is furthermore to provide an encapsulation of both sensor structures on a chip under a vacuum, wherein the acceleration sensor is accommodated in a cavity which is separate from the rate-of-rotation sensor and which has a ventilation opening. The ventilation opening is closed off hermetically for example after the encapsulation process under the pressure necessary for the acceleration sensor in a further method step.

In order to close off the ventilation opening under a pressure set in a targeted manner, homogeneous layer depositions that close off the entire wafer as a whole are known. This is provided for example with the use of sputtering or vapor depositions, such as chemical vapor deposition (CVD), plasma-enhanced chemical vapor deposition (PECVD), low pressure CVD (LPCVD), etc. However, for the reliable vacuum-tight closure of the ventilation opening, these methods require reduced pressure, which limits the maximum pressure to be set. Moreover, it is necessary to protect the encapsulated structure against the penetration of the layers into the cavity. Furthermore, stringent process engineering requirements are imposed during production in order that the closure of the ventilation opening is not prevented by particles or inadequate layer growth. Furthermore, the ventilation opening can also be closed off by the dispensing of closure material. However, this has the disadvantage that each chip has to be closed off individually and the closure materials have to be hermetically vacuum-tight.

Overall, the methods known heretofore are very cost-intensive.

It is an object of the present invention to provide at least two micromechanical structures in a component, in conjunction with cost-effective production of the component.

The object is achieved by means of the features of the components and methods in accordance with the present invention.

SUMMARY AND INTRODUCTORY DESCRIPTION OF THE INVENTION

The present invention is based on the concept of providing a component and a method for producing the component, wherein the integration of micromechanical structures in a substrate can be provided and the micromechanical structures can be operated under different atmospheric conditions. The substrate is for example part of a microchip which can be used in arbitrary surroundings, for example in vehicles. Appropriate vehicles include motor vehicles, in particular, in which different measurement objectives are required in order, for example, to provide airbag triggering or drive control.

In this case, it is possible to provide two micromechanical structures each respectively in a cavity. Said micromechanical structures can be different types of sensor in one component. In this case, the two types of sensor can be produced by means of the same micromechanical technologies, which makes possible simultaneous manufacture on a substrate. By using a channel, that is to say an opening with a feed, it is possible to set a second pressure independently of a first pressure in a cavity, without the need to generate a reduced pressure prior to the closure process.

A reduction of the manufacturing costs of the substrates is advantageous in this case. By way of example, a silicon wafer is used as the substrate. In this case, an individual product type is manufactured, such that only one component or chip instead of two components or chips is assembled into a package and is processed as a unit in the calibration and test processes. This simplifies the manufacturing process and also the quality assurance of the component. After production and testing, the component can be integrated into an electronic circuit, e.g. onto a printed circuit board (PCB). With the use of one component instead of a plurality of components, the space requirement and mounting complexity can be reduced.

The production of the component according to the invention can be carried out by means of bonding processes. Conventional wafer substrates and conventional bonding processes known from microsystems technology can be used in this case. The components according to the invention can be produced cost-effectively and reliably in this way. The invention thus provides a simple and cost-effective integration of structures on a substrate which are operated under different atmospheric conditions, in particular under different pressures.

There are multiple possibilities for producing the components according to the invention. In this case, micromechanical elements are provided which are each exposed to a gas pressure on a substrate, for example a chip, wherein the gas pressures can be different. In this case, a first cavity includes a first gas pressure and a second cavity includes a second gas pressure, wherein the micromechanical elements or sensors are respectively arranged within the cavities. In this case, the cavities are arranged in a manner hermetically separated from one another.

The production method provides that the micromechanical elements of a wafer with the desired first gas pressure are already hermetically encapsulated, while all further micromechanical elements of the same wafer with the desired second gas pressure also have a channel for gas exchange or air exchange with the surroundings. The channel can be produced in the preceding process sequence or method step at any point for example at the substrate level or wafer level by means of methods appertaining to wet or dry etching technology. In this case, exit openings of the channels of the micromechanical elements within the second gas pressure lie on the same side of the substrate or wafer assemblage. This simplifies the manufacturing method.

The encapsulation of the micromechanical elements with the first gas pressure can take place in the preceding process sequence or as a method step at any point for example with the aid of wafer bonding methods. During the hermetic encapsulation of the micromechanical elements which are surrounded with the first gas pressure, the desired first gas pressure can be set by customary methods.

In addition, the further micromechanical elements are encapsulated with the second gas pressure at the wafer level by means of a wafer bonding process. In this case, the desired gas pressure under which the micromechanical elements are intended to be closed off with the second gas pressure is chosen at a wafer bonder. In this case, a so-called closure wafer can be permanently bonded onto that side of the wafer assemblage on which there are the exit openings of the channels of the micromechanical elements with the second gas pressure. The use of a channel makes it possible to close off openings in different substrate layers of the component, such that during the production of the component no further measures need be taken in order to set a pressure in a cavity in which the respective channel opens.

Developments of the method can be method steps which analogously realize the features of the specified components according to the dependent claims.

BRIEF DESCRIPTION OF THE DRAWING

The above-described properties, features and advantages of this invention and the way in which they are achieved will become clearer and more clearly understood in association with the following description of the exemplary embodiments which are explained in greater detail in association with the drawings, in which:

FIG. 1 to FIG. 8 show a first exemplary embodiment for producing a micromechanical structure according to the invention;

In this case, in the figures, identical reference signs are used for identical or similar elements.

CONTINUED DESCRIPTION OF THE INVENTION

Figure 5:
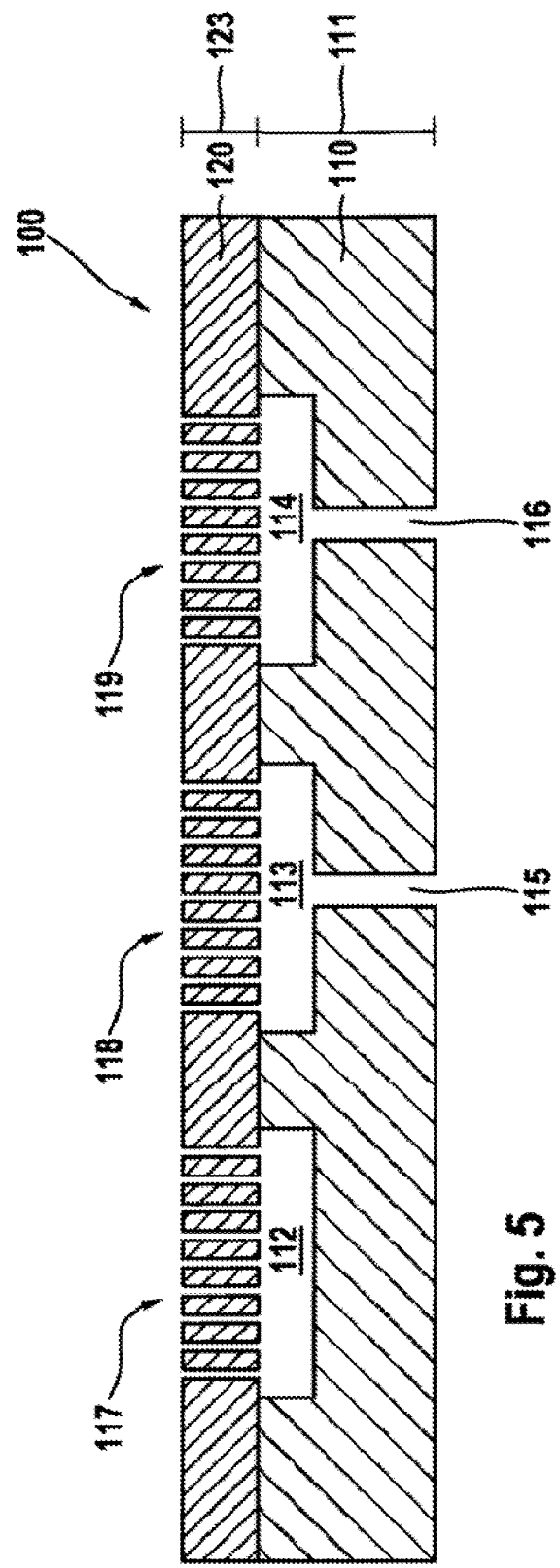

Aspects which are provided on the basis of processes or method steps appertaining to silicon micromechanics are described in the following FIGS. 1 to 14. It is also possible to use other technologies in which locally delimited penetrations in the substrate and vacuum-hermetic substrate-to-substrate connection technologies are possible.

FIG. 1 to FIG. 8 show a first exemplary embodiment for producing a micromechanical structure according to the invention.

FIG. 1 shows a substrate 100. In a carrier wafer 110 having a first height 111, here a silicon wafer, cavities 112, 113, 114 separated from one another are introduced for each structure which is intended to be enclosed under a separate gas pressure, as illustrated in FIG. 1.

Afterward, on the substrate 100, by means of vacuum-hermetic wafer bonding methods, for example high- or low-temperature fusion bonding or anodic wafer bonding, the cavities 112, 113, 114 are closed off with a further silicon wafer 120 having the height 121, wherein the second wafer 120 serves as a structure wafer. The construction of the two wafers 110, 120 lying one above the other with enclosed cavities 112, 113, 114 is illustrated with reference to FIG. 2.

FIG. 3 shows how the structure wafer 120 is subsequently thinned to a required thickness, that is to say that its original height 121 is reduced to a height 123. Then, from the cavity side, by means of anisotropic etching methods, channels 115, 116 are etched into the wafer 110 for example at the lower region of the structure 100, as shown in FIG. 4. In this case, the channels 115, 116 respectively extend right into those cavities 113, 114 respectively, which are intended to have a different pressure than the first gas pressure in the first cavity 112. The actual structure 117, 118, 119 (shown in FIG. 5) is then fashioned into the thinned structure wafer 120 by means of anisotropic structuring methods, such as, for example, dry etching by means of deep reactive ion etching (DRIE), etching by means of potassium hydroxide solution (KOH solution), etc., as shown in FIG. 5. Structures 117, 118, 119 serve as micromechanical structures of sensors.

Figure 6:
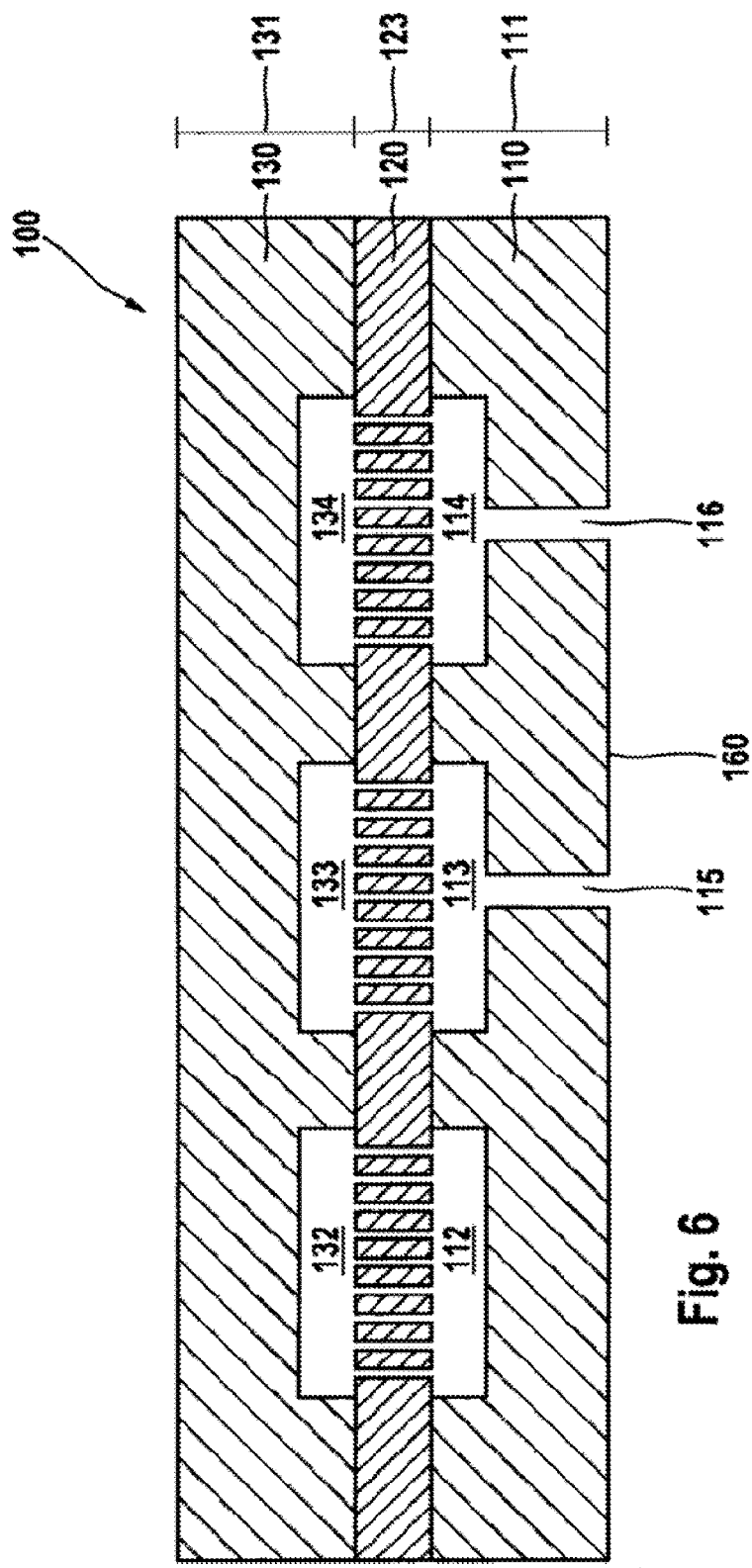

In FIG. 6, the structures 117, 118, 119 are then closed off vacuum-hermetically with a further wafer 130 having a height 131, also designated as a cover wafer. This cover wafer 130 in turn has dedicated cavities 132, 133, 134 for each structure 117, 118, 119, respectively. An alternative involves resetting the structures 132, 133, 134 in the structure wafer 120 by means of a depression, such that the cover wafer 130 can be applied to the structure wafer 120 in a planar fashion.

Figure 7:
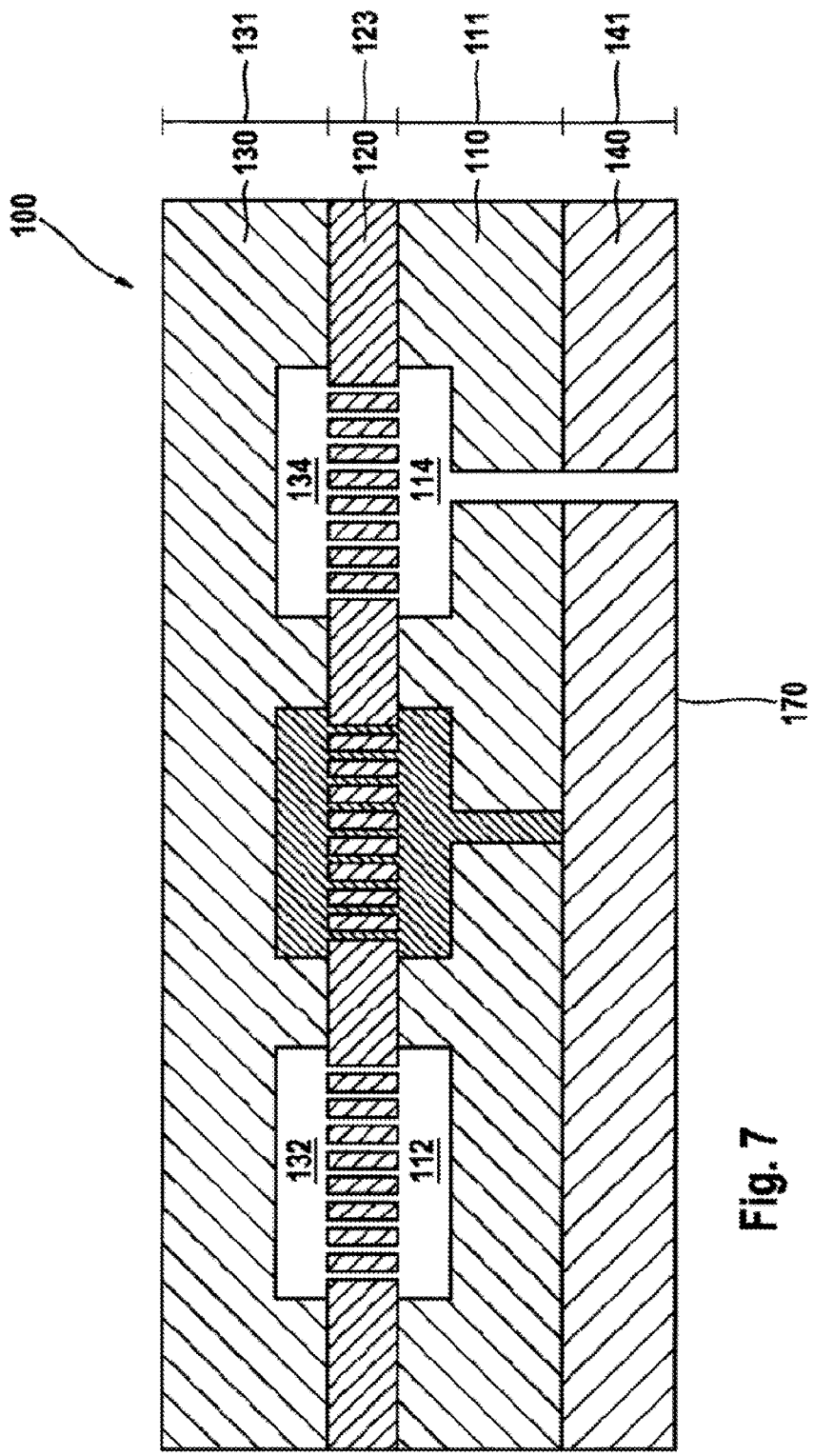
Figure 8:
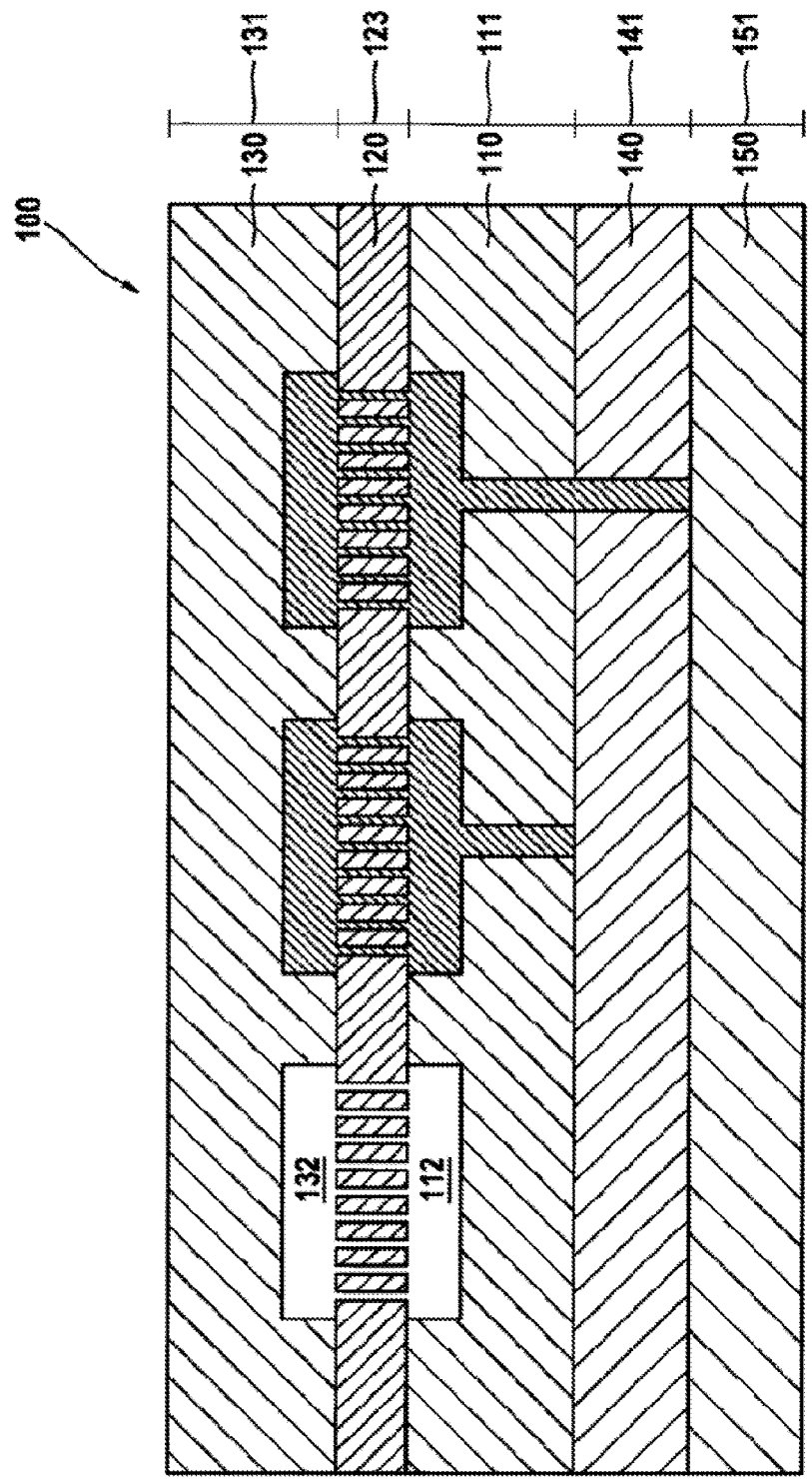

Subsequently, a further wafer 140 having a height 141, also designated as a closure wafer, is bonded onto the carrier wafer 110 under a different pressure than the first gas pressure, as illustrated in FIG. 7. If further pressures that differ from the first and second gas pressures are intended to be set, then the closure wafer 140 has channels at the locations at which the carrier wafer 110 already has connecting channels to the corresponding elements 114, 119, 134. A second closure wafer 150 having a height 151 can be bonded against the first closure wafer 140 in order to enclose the desired third gas pressure, as shown in FIG. 8.

The procedure illustrated can then be repeated for any different gas pressures. In this case, provision can be made for thinning closure wafers 140 and 150 in accordance with technological conditions in order to reduce the thickness of the overall construction. A reduction of the overall wafer height can be provided for example by means of grinding, polishing and/or chemical mechanical polishing (CMP), for example to thicknesses of less than approximately 20 µm.

FIG. 9 to FIG. 14 show a second exemplary embodiment for producing a micromechanical structure according to the invention.

Figure 9:
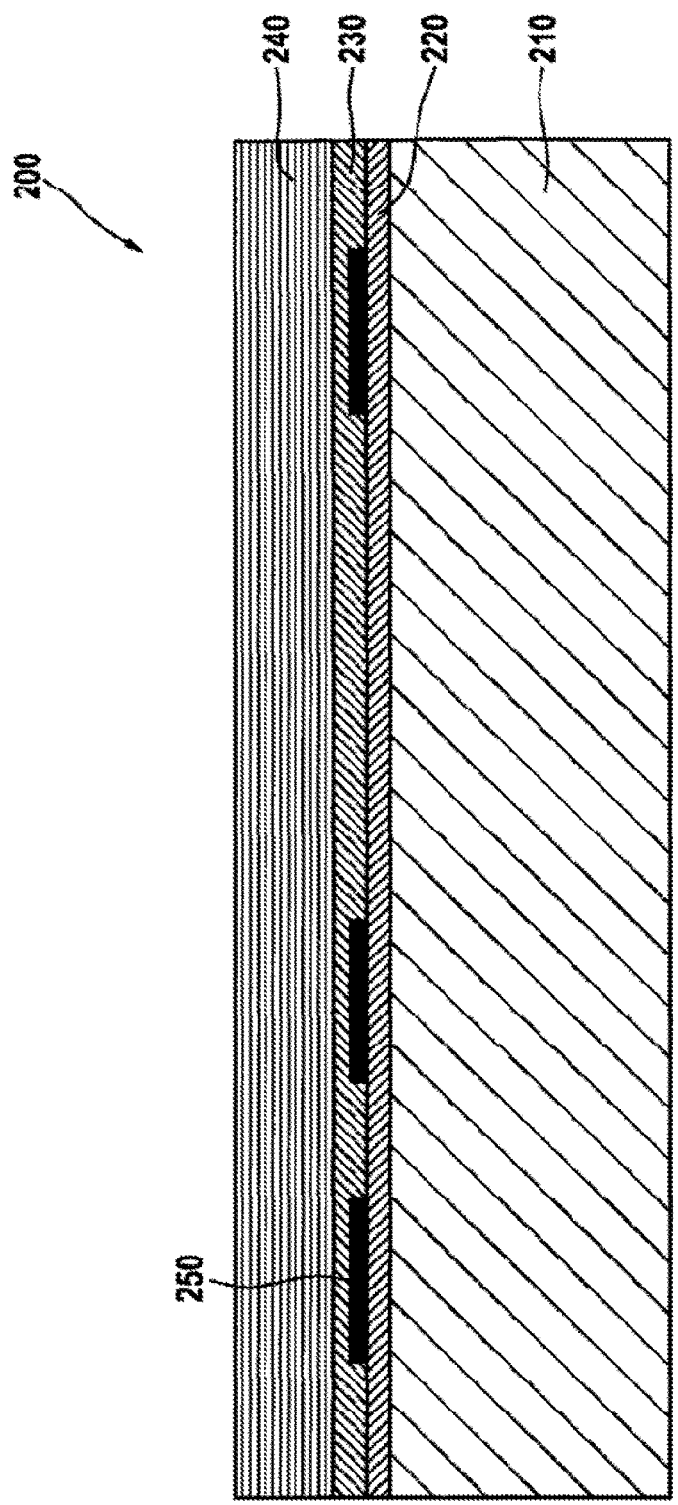
FIG. 9 to FIG. 14 show a second exemplary embodiment for producing a micromechanical structure according to the invention.

FIG. 9 shows a layer construction of a substrate 200 having a base wafer 210, a first embedding layer 220, a second embedding layer 230, a structure ply or a structure wafer 240 and an embedded conductive electrode layer 250. In this case, the first embedding layer 220 and the second embedding layer 230 can each have insulating properties and be removed by methods appertaining to etching technology in each case.

Figure 10:
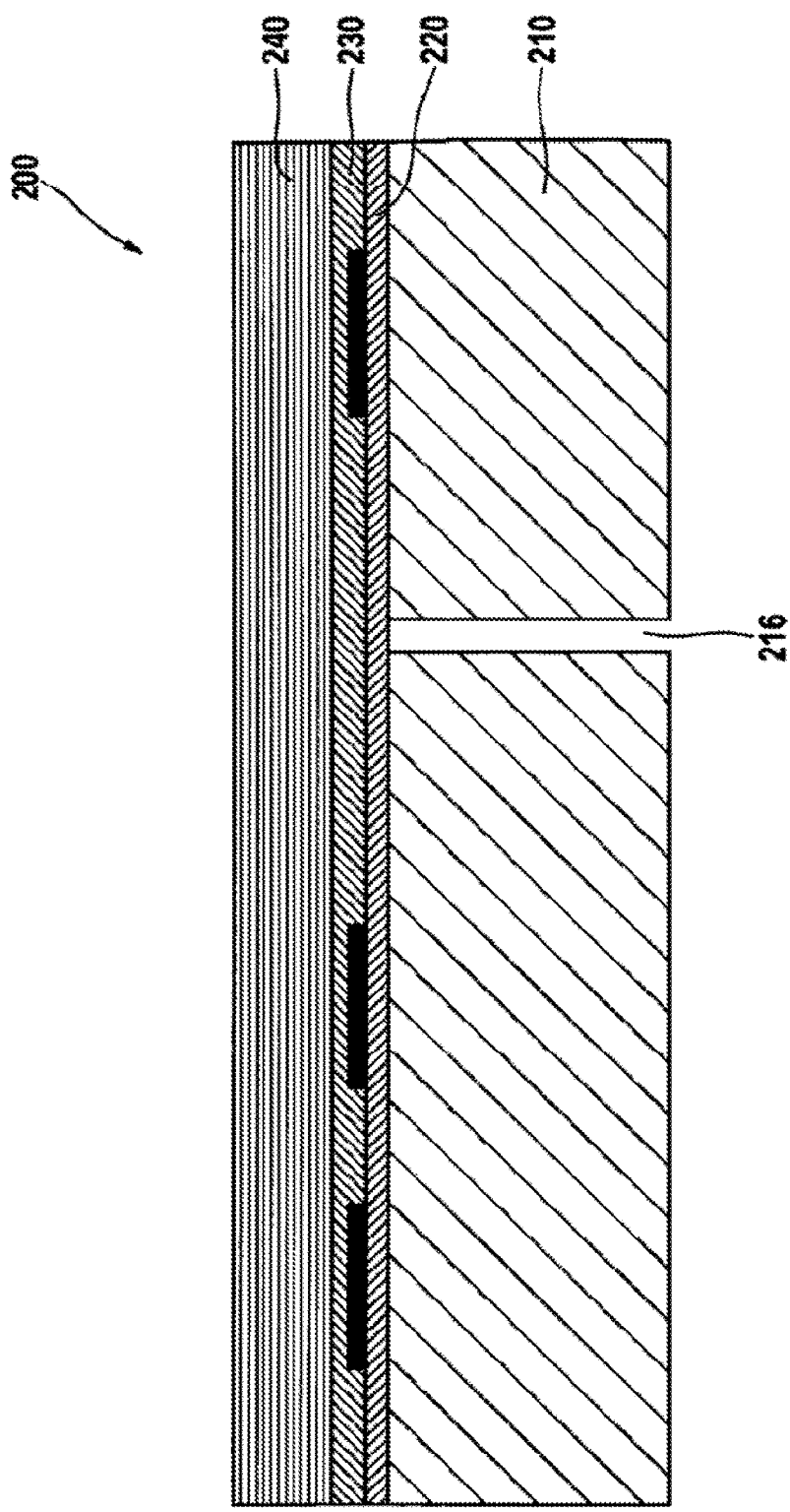

An opening or a channel 216 can then be arranged into the base wafer 210 at predetermined locations for example by means of a dry or wet etching method, thus resulting in a connection to elements within a cavity 213 to be produced, the pressure of which is set only later in time. This geometry is illustrated in FIG. 10.

Figure 11:
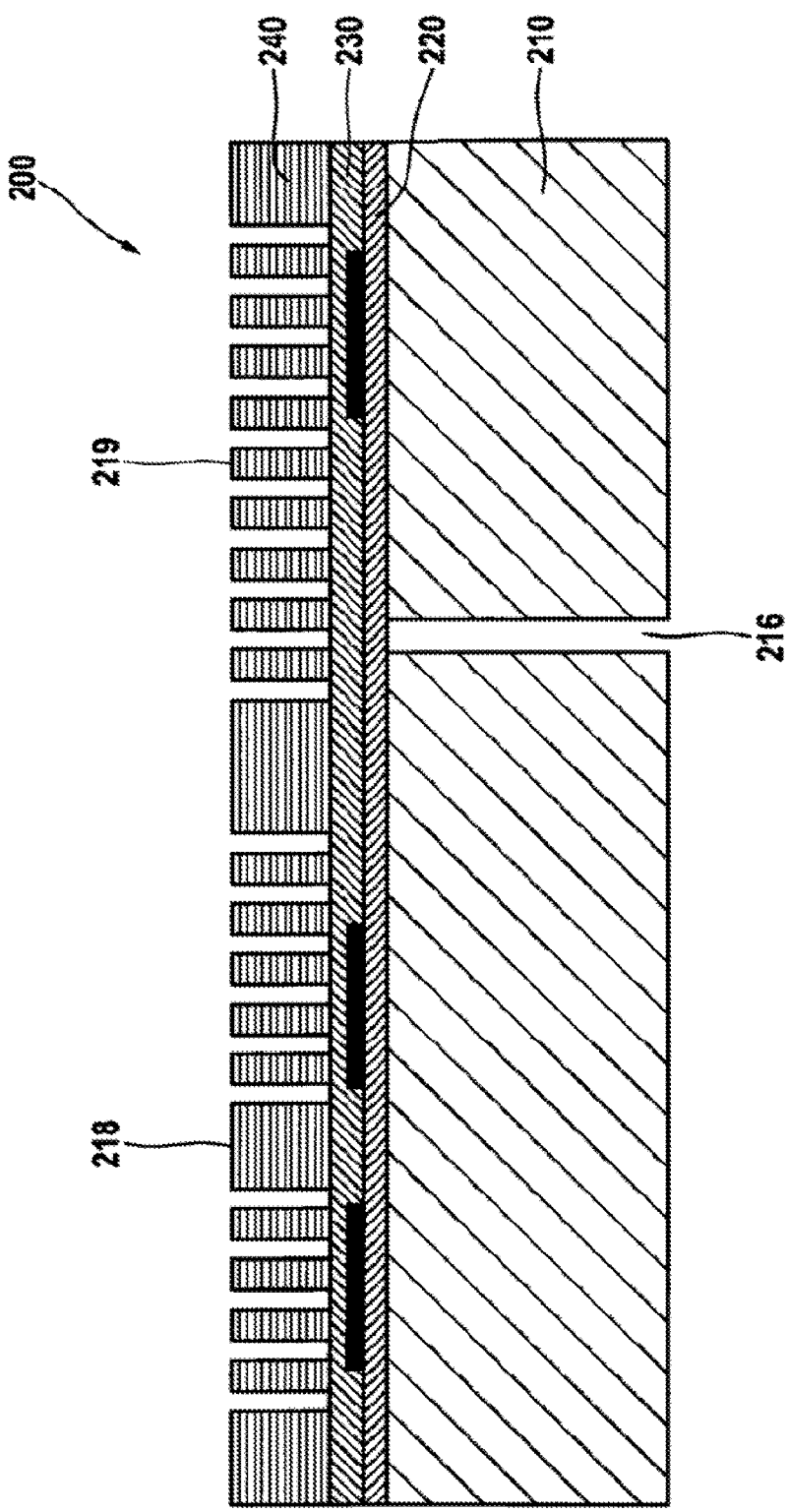

Afterward, as shown in FIG. 11, micromechanical geometries 218, 219, such as mass-spring systems, are provided in the structure ply or in the structure wafer 240 by means of customary micromechanical etching techniques. These mass-spring systems 218, 219 are initially still mechanically connected to the embedding layer 230. In order that the micromechanical structures are freely movable, the embedding layers 220 and 230, which can be manufactured from silicon dioxide, for example, are also removed. The removal can be effected by means of wet-chemical etching, for example, such that, on the one hand, micromechanical structures 218, 219 are freely movable, but on the other hand mechanical anchoring of the micromechanical structures 218, 219 on the base wafer 210 still remain.

Figure 12:
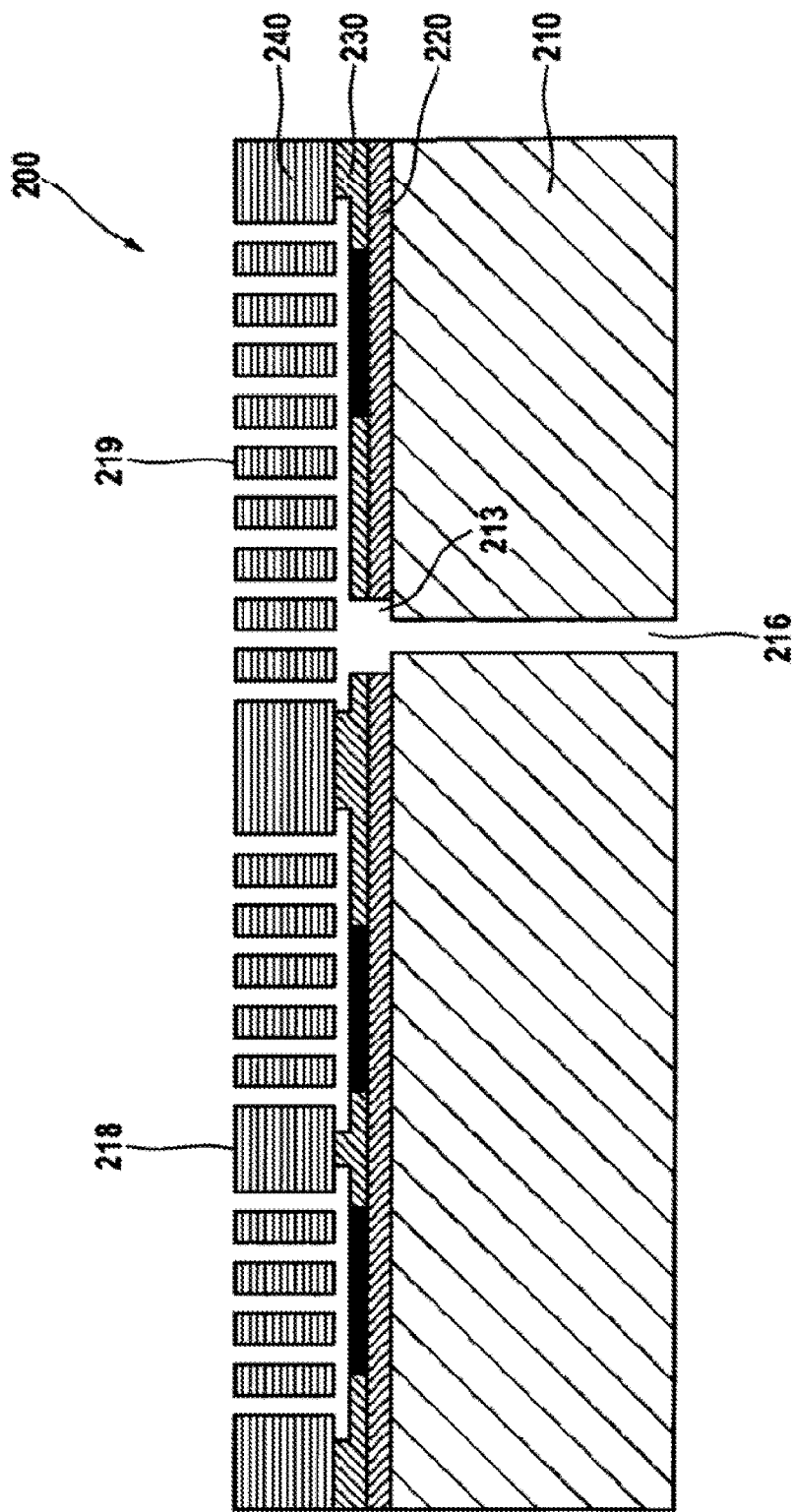

Furthermore, the connecting channel 216 closed off at one end thereof by the embedding layers 220 and 230 is simultaneously opened as a result of the removal of the embedding layers 220 and 230, as illustrated in FIG. 12. In this way, a cavity 213 arises at the end of the channel 216.

Figure 13:
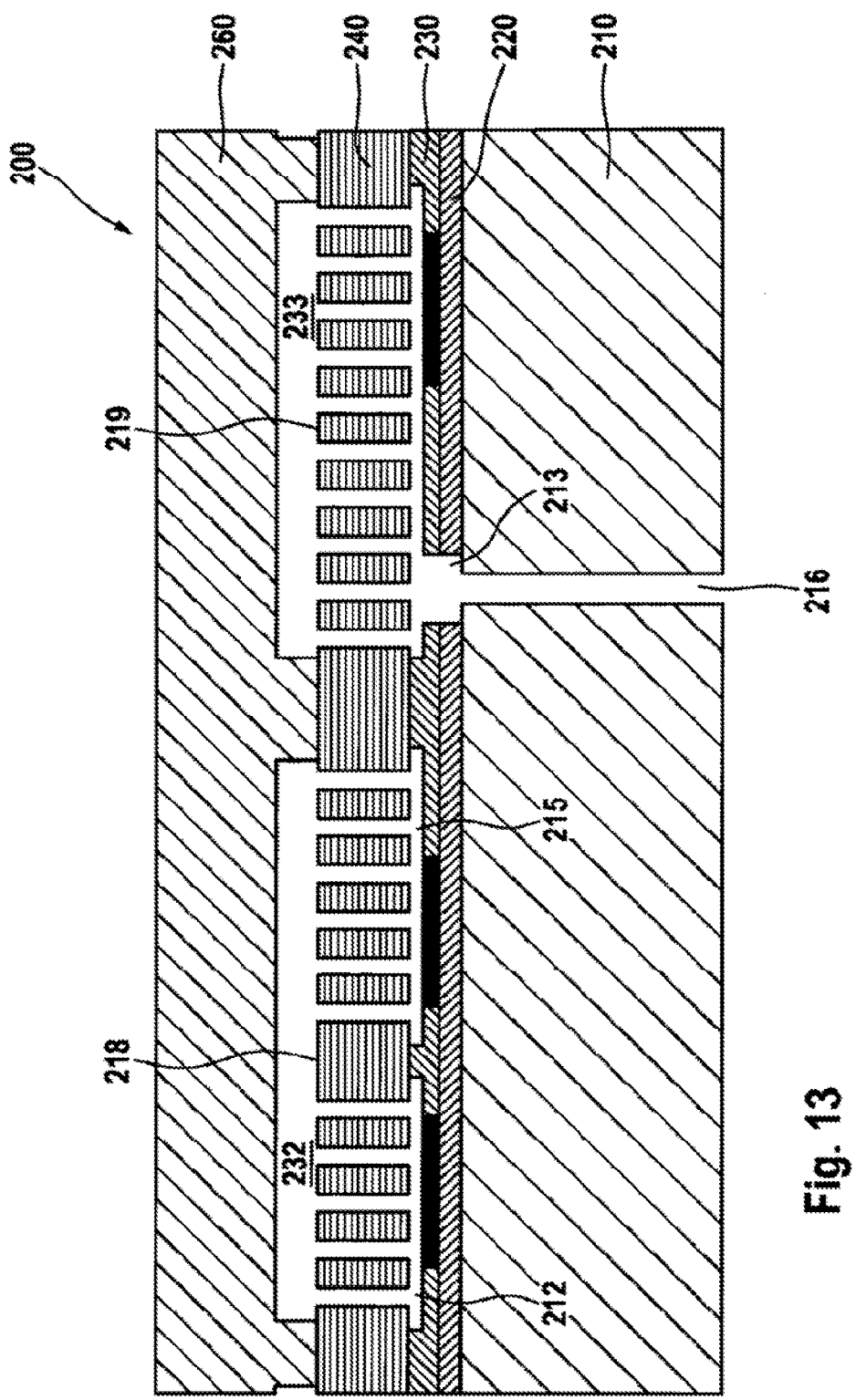

Afterward, the elements 218 and cavities 212, 215, 232 adjacent thereto can be closed off hermetically under the desired pressure, for example by a cover wafer 260 being applied to the wafer assemblage by means of a wafer bonding method. The elements 219 and cavities 213, 233 are still connected to the surroundings via the channel 216, as shown in FIG. 13.

Figure 14:
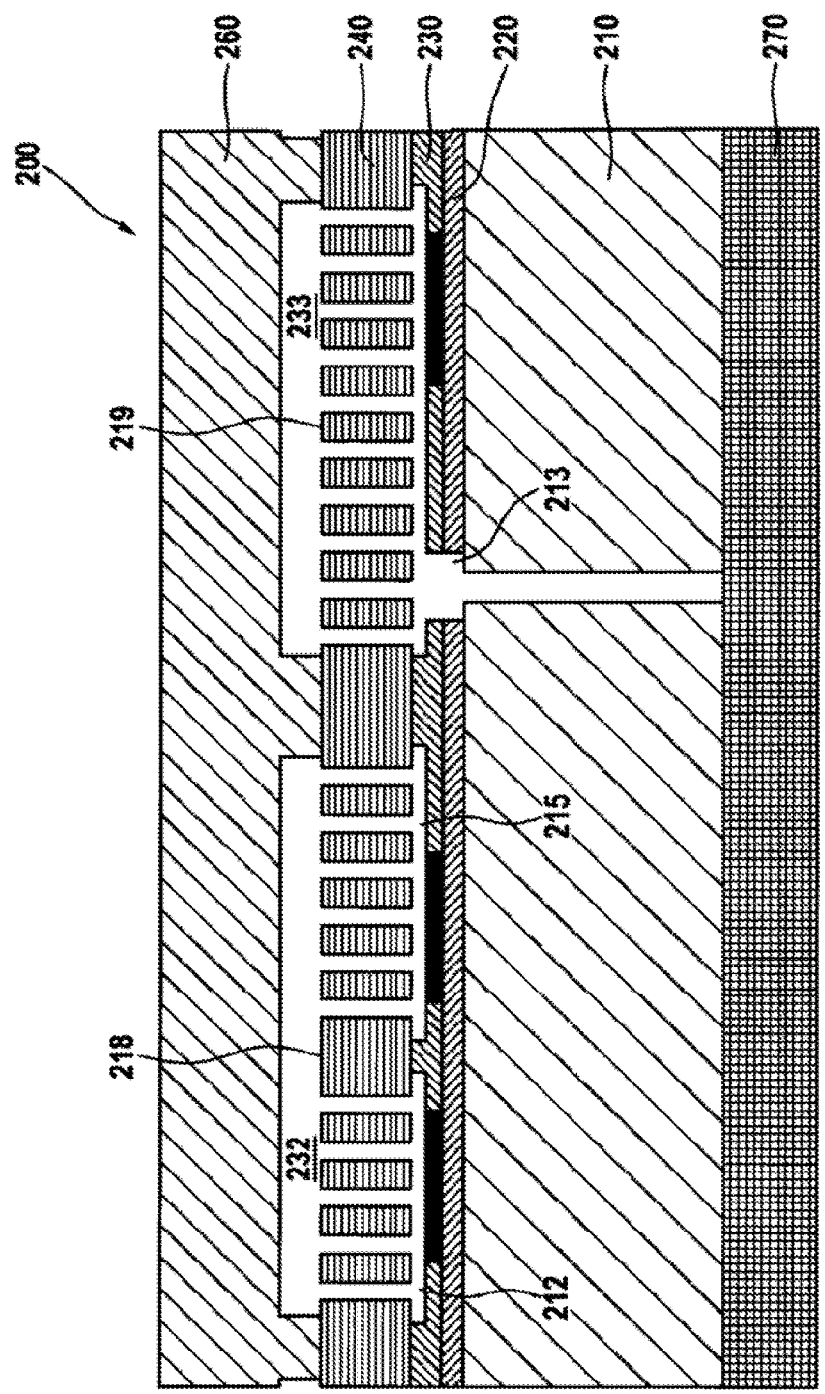

Finally, likewise by means of a wafer bonding method, a closure wafer 270 can be connected to the wafer stack under a specific pressure such that the channel 216 of the elements 219 and cavities 213, 233 is closed off hermetically and a desired pressure is established there, as illustrated in FIG. 14.

While the above description constitutes the preferred embodiment of the present invention, it will be appreciated that the invention is susceptible to modification, variation and change without departing from the proper scope and fair meaning of the accompanying claims.

The invention claimed is:

1. A component comprising:
    a substrate having a first cavity and a second cavity;
    a first micromechanical structure arranged in the first cavity;
    a second micromechanical structure arranged in the second cavity;
    wherein the first cavity has a first gas pressure;
    wherein the second cavity has a second gas pressure;
    wherein the first gas pressure is provided by a closed configuration of the first cavity;
    wherein a first channel opens into the second cavity, and the second gas pressure is adjustable via the first channel;
    the second gas pressure is different from the first gas pressure; and
    wherein the substrate comprises a plurality of substrate layers embodied in the form of wafer layers, and at least one of the substrate layers in the form of a closure wafer which closes the first channel.

2. The component as claimed in claim 1, wherein the second micromechanical structure arranged in the second cavity, is closed off by means of the closure wafer bonded to another substrate layer of the plurality of substrate layers.

3. The component as claimed in claim 1 further comprising at least one of the first and the second micromechanical structures is an inertial sensor in the form of an acceleration sensor or a rate-of-rotation sensor.

4. The component as claimed in claim 1 further comprising in that the component is a microchip adapted for use in a motor vehicle.

5. The component as claimed in claim 1, wherein the substrate comprises a plurality of substrate layers including a carrier wafer and a second wafer bonded to the carrier wafer.

6. The component as claimed in claim 5, further comprising the carrier wafer forming the micromechanical structure and the second wafer forming the first and the second cavities.

7. A component comprising:
a substrate having a first cavity and a second cavity;
a first micromechanical structure arranged in the first cavity;
a second micromechanical structure arranged in the second cavity;
wherein the first cavity has a first gas pressure;
wherein the second cavity has a second gas pressure;
wherein the first gas pressure is provided by a closed configuration of the first cavity;
wherein a first channel opens into the second cavity, and the second gas pressure is adjustable via the first channel;
the second gas pressure is different from the first gas pressure; and
the substrate has a third cavity, wherein a third micromechanical structure is arranged in the third cavity and a third gas pressure is adjustable in the third cavity via a second channel isolated from the first channel, and the third gas pressure is different than the first and the second gas pressures.

8. The component as claimed in claim 7, further comprising wherein an end of the first channel ends at a closure wafer and an end of the second channel ends at a second closure wafer.

9. The component as claimed in claim 7 further comprising at least one of the first and the second micromechanical structures is an inertial sensor in the form of an acceleration sensor or a rate-of-rotation sensor.

10. The component as claimed in claim 7 further comprising in that the component is a microchip adapted for use in a motor vehicle.

11. The component as claimed in claim 7, wherein the substrate comprises a plurality of substrate layers including a carrier wafer and a second wafer bonded to the carrier wafer.

12. The component as claimed in claim 11, further comprising the carrier wafer forming the micromechanical structure and the second wafer forming the first and the second cavities.

* * * * *